(12) United States Patent
Piasecki et al.

(10) Patent No.: US 6,529,152 B1
(45) Date of Patent: Mar. 4, 2003

(54) HIGH PRECISION SAR CONVERTER USING RESISTOR STRIP WITH AUTO ZEROING FUNCTION

(75) Inventors: Douglas S. Piasecki, Austin, TX (US); Ka Y. Leung, Austin, TX (US)

(73) Assignee: Cyngal Integrated Products, Inc., Austin, TX (US)

(*) Notice: Subject to any disclaimer, the term of this patent is extended or adjusted under 35 U.S.C. 154(b) by 0 days.

(21) Appl. No.: 09/901,845

(22) Filed: Jul. 9, 2001

Related U.S. Application Data

(63) Continuation-in-part of application No. 09/419,148, filed on Oct. 15, 1999, now Pat. No. 6,288,661.

(51) Int. Cl.[7] ............................................. H03N 1/66
(52) U.S. Cl. ..................... 341/144; 341/136; 341/145; 341/153; 341/154
(58) Field of Search .................................. 341/144, 154, 341/153, 156, 145

(56) References Cited

U.S. PATENT DOCUMENTS

| | | |
|---|---|---|
| 3,329,921 A | 7/1967 | Badelt |
| 4,215,333 A | 7/1980 | Huang |
| 4,219,797 A | 8/1980 | Huang |
| 4,228,418 A | 10/1980 | Piedmont et al. |
| 4,447,747 A | 5/1984 | LaPotin |
| 4,455,547 A | 6/1984 | Murakami et al. |
| 4,466,013 A | 8/1984 | van de Plassche et al. |
| 4,845,462 A | 7/1989 | van de Grift et al. |
| 5,010,337 A * | 4/1991 | Hisano et al. ............... 341/119 |
| 5,014,054 A * | 5/1991 | Oshita et al. ................ 341/145 |
| 5,016,014 A * | 5/1991 | Bitting ......................... 341/145 |
| 5,036,322 A * | 7/1991 | Barrow et al. .............. 341/118 |
| 5,049,882 A * | 9/1991 | Gorecki et al. ............. 341/143 |
| 5,059,978 A * | 10/1991 | Valdenaire .................. 341/144 |
| 5,079,552 A * | 1/1992 | Pelgrom et al. ............. 341/144 |
| 5,181,034 A * | 1/1993 | Takakura et al. ........... 341/144 |
| 5,218,225 A | 6/1993 | Zanders |
| 5,257,005 A | 10/1993 | Desroches et al. |
| 5,604,501 A * | 2/1997 | McPartland ................. 341/144 |
| 5,640,137 A | 6/1997 | Mantha |
| 5,731,775 A | 3/1998 | Gross, Jr. et al. |

* cited by examiner

*Primary Examiner*—Michael Tokar
*Assistant Examiner*—Lam T. Mai
(74) *Attorney, Agent, or Firm*—Howison, Thoma & Arnott, L.L.P.

(57) ABSTRACT

A digital-to-analog converter having a semiconductor resistor strip with plural voltage taps. One voltage tap formed of the semiconductor material defines a nonzero reference voltage for the converter. An auto-zeroing amplifier is utilized to charge a coupling capacitor to the nonzero reference voltage. In the conversion process, the analog voltages at the other voltage taps of the resistor strip are selected via a switch arrangement and coupled to the coupling capacitor. The linearity of the digital-to-analog converter is thus more independent of parasitic resistances that may be formed in the ground connection to the resistor string.

16 Claims, 3 Drawing Sheets

HIGH PRECISION SAR CONVERTER USING RESISTOR STRIP WITH AUTO ZEROING FUNCTION

CROSS-REFERENCE TO RELATED APPLICATIONS

This application is a Continuation-in-part patent application of U.S. application Ser. No. 09/419,148 filed Oct. 15, 1999 now U.S. Pat. No. 6,288,661 and entitled "A/D CONVERTER WITH VOLTAGE/CHARGE SCALING," the entire disclosure of which is incorporated herein by reference. This application is related to the U.S. patent applications filed herewith, entitled "RESISTOR STRIP TAP FOR A/D SAR CONVERTER", identified by Ser. No. 09/901,853 and "RESISTOR STRIP VOLTAGE TAP CONSTRUCTION FOR A/D SAR CONVERTER", identified by Ser. No. 09/901,750.

TECHNICAL FIELD OF THE INVENTION

This invention is related in general to digital-to-analog (D/A) converters, and more particularly to D/A converters using a resistor strip and an auto zeroing function in the conversion between digital and analog signals.

BACKGROUND OF THE INVENTION

Digital-to-analog converters (DAC) find a wide variety of applications in converting digital signals to corresponding analog voltages. Digital-to-analog converters also find a more specific application in converting a succession of processor-generated digital words to analog voltages for generating tones, sounds, voice signals, etc.

The prior art is replete with various techniques for converting digital signals to corresponding analog voltages. Numerous different types of conversion circuits are well known to those skilled in the art. One technique for converting a digital signal to a corresponding analog voltage is by way of a resistor strip and a switch arrangement. The resistor strip includes a number of series-connected resistors for providing different analog voltages. The switches are utilized for selectively extracting a voltage from one of the nodes of the resistor strip. The particular switch or switches that are operated is a function of the logic states of the bits of the digital word being converted. With this technique, it is common to utilize a successive approximation register (SAR) circuit to make successive attempts at selecting the correct analog voltage from one of the resistor strip nodes, such that the voltage uniquely matches the value of the digital word.

The number of resistors required to complete the conversion process is related to the number of bits comprising the digital word. A twelve-bit digital word represents 4,096 different combinations of logic states, and in a conversion process can correspond to 4,096 different analog voltage levels. In the simplest case, a resistor strip having 4,095 equal-value resistors connected in series could be used to produce the same number of analog voltage levels, including ground. Various other techniques and schemes are readily known to those skilled in the art for reducing the number of resistors required in order to produce the requisite number of analog levels as a function of the number of bits in the digital word.

The fabrication of resistor strips in a semiconductor chip for a DAC is well known to those skilled in the art. FIG. 1 illustrates a portion of a semiconductor resistor strip 10 fabricated with a polycrystalline silicon (polysilicon), appropriately doped to provide the desired number of ohms per square. The polysilicon resistor strip 10 is formed by depositing a layer of polysilicon 12, masking the same and etching the masked polysilicon in the general shape shown in FIG. 1. A number of nodes or taps, one shown as reference numeral 14, are formed in the semiconductor material. In other variations, taps or nodes may be formed on both sides of the resistor strip 10. Each tap, such as voltage tap 14 and voltage tap 16, are spaced apart identically, as is the physical distance between tap 16 and 18, as well as the distance between tap 18 and tap 20 and so on. In this manner, the voltage drop between tap 14 and tap 16 is preferably identical to the voltage drop between tap 16 and tap 18, as well as that between tap 18 and tap 20.

At the bottom of the resistor strip 10 there is a contact 26 connected by interlevel metal to a ground conductor 28 which is shown in phantom. The ground conductor 28 can constitute ground itself, or a conductor that is connected to a common circuit ground, denoted in FIG. 1 as reference numeral 30.

As can be appreciated, in a unipolar conversion process, when the digital bits of a word all have a zero value, the corresponding analog voltage is 0.00 volts. In this situation, the bottom-most voltage tap 26, which is connected to ground, is generally selected by switches (not shown) for coupling a zero voltage to the output of the DAC. A digital value of 00 . . . 001 will cause the voltage at tap 20 to be selected by the switch arrangement. Tap 20 represents the smallest non-zero analog voltage generated by the resistor strip 10, since it is located next to the ground tap 26. The voltages between the resistor taps may be in. the low millivolt range, such as one or two millivolts. As such, not only is the uniformity of the spacing between the taps necessary, but also a ground tap 26 that is in fact 0.00 volts.

In practice, the interlevel contact structure inherently includes some resistance, as does the ground conductor 28. As such, the voltage at the bottom tap 26 is not ideally zero volts, but rather may be some tens or hundreds of microvolts. Accordingly, when carrying out the digital-to-analog conversion, there is an inherent error because the ground tap 26 is not ideally zero volts. This error is also present in the conversion of each of the other combination of bits, as the voltage at each tap 14–20 is generated with respect to ground in the DAC of FIG. 1. When high precision is required in the conversion process, the error generated because of the non-zero voltage at tap 26 causes the accuracy and linearity to be compromised.

From the foregoing, it can be seen that a need exists for a technique in reducing the non-linearities and inaccuracies caused by DAC resistor strips which utilize a ground tap at one end thereof. Another need exists for a DAC utilizing a grounded resistor strip, but where the conversion process is independent of any undesirable non-zero voltage at the ground tap.

SUMMARY OF THE INVENTION

In accordance with the principles and concepts of the invention, there is disclosed a D/A circuit that overcomes the disadvantages and shortcomings of the prior art techniques. In accordance with a disclosed embodiment of the invention, a resistor strip is fabricated in a semiconductor material with a plurality of voltage taps. A current that passes through the resistor strip generates a voltage at each tap. The difference in voltage (Δv) between each tap is ideally equal, thereby providing equal increments of voltage along the resistor strip taps. One end of the resistor strip is preferably grounded or coupled to a common or reference voltage. However, rather than utilizing the reference of zero volts, namely, the ground voltage, the reference voltage utilized is at the first non-zero voltage tap formed in the resistor strip. Accordingly, in order to provide, for example, 256 different analog voltages, 257 voltage taps are provided, with the bottom non-grounded voltage tap of the resistor strip representing the reference. This non-zero reference voltage at the first resistor strip tap can be selected when the logic states of the digital bits are all zeroes.

In accordance with an additional feature of the invention, the analog voltage output from the resistor strip, via a switch arrangement, is capacitor-coupled to an amplifier. The amplifier is configured to provide automatic zeroing with respect to the non-zero voltage of the first or reference resistor strip tap. With this arrangement, any imperfect grounding or ground resistance terminating the resistor strip to ground is overcome and otherwise eliminated from affecting the conversion process. Linearity of the conversion process is thus independent of the quality of the ground connection to the resistor strip.

The semiconductor resistor strip of the invention is constructed with multiple taps and connected to high impedance conversion circuits so that current entering the resistor strip from a supply voltage does not exit the resistor strip by way of the voltage taps. Hence, the contact resistance that may be present in the voltage tap contacts does not affect the analog voltage selected from the voltage taps. According to one aspect, the voltage taps of the resistor strip are formed as arms on the sides of the polysilicon strip, so that the current flowing through the bulk of the resistor strip is unaffected by any contact resistance inherent in the voltage taps.

Once the polysilicon strip is formed with the voltage tap arms extending from the sides thereof, a mask is formed over the polysilicon body portion of the resistor strip, except for the arms. The chip is then subjected to a siliciding process. With this technique, only the voltage tap arms are silicided for allowing a quality contact to be made to the resistor strip. In the masking of the resistor strip, the ends thereof which employ current carrying-contacts may also be exposed so as to be silicided to thereby provide low-resistance current-carrying contacts.

BRIEF DESCRIPTION OF THE DRAWINGS

Further features and advantages will become apparent from the following and more particular description of the preferred and other embodiments of the invention, as illustrated in the accompanying drawings in which like reference characters generally refer to the same parts, components or elements throughout the views, and in which.

DETAILED DESCRIPTION OF THE INVENTION

Figure 2:
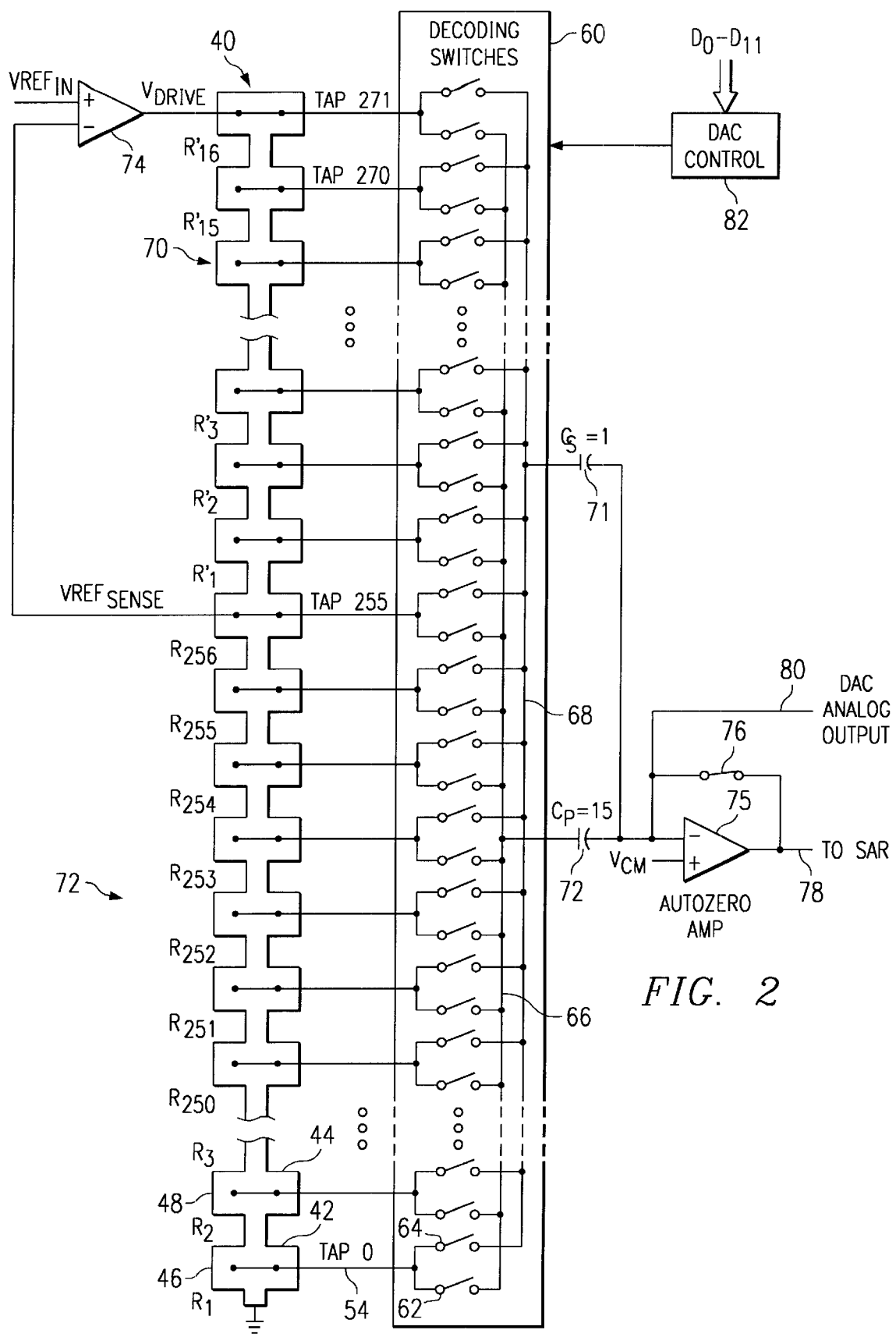
FIG. 2 illustrates a semiconductor resistor strip constructed in accordance with an embodiment of the invention, as connected by a switch arrangement in a capacitive manner to an amplifier.

With reference now to FIG. 2, there is illustrated a D/A converter constructed according to one embodiment of the invention. The resistor strip 40 is constructed of a linear strip of polysilicon material appropriately doped with an impurity to produce a desired resistivity. Preferably, the polysilicon resistor strip 40 is doped with an N-type dopant to achieve a resistivity of about 189 ohms per square. P-type dopants can also be utilized with suitable effectiveness. The particular resistivity is not critical, only that it be uniform throughout the body of the resistor strip 40. By making the polysilicon material of the resistor strip 40 uniform in resistivity throughout its length, and by making the various voltage taps evenly spaced apart, the voltage between each tap is substantially identical.

Figure 3:
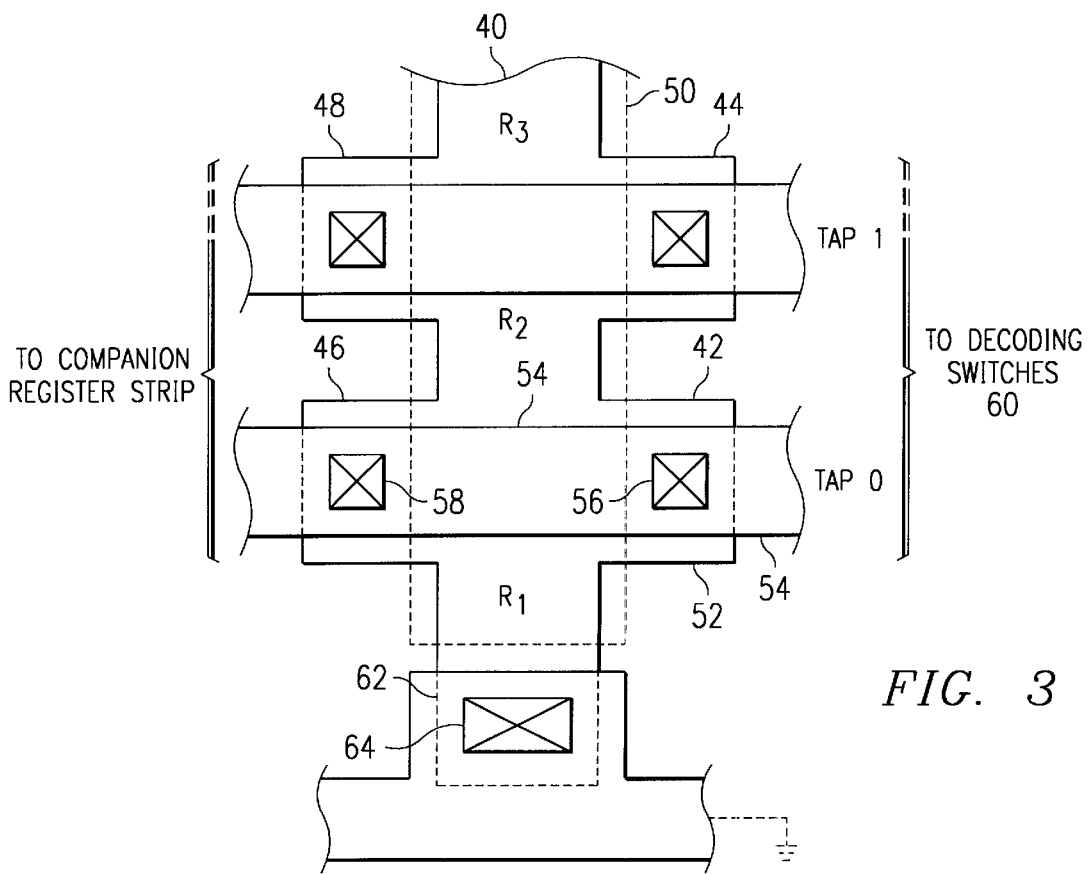
FIG. 3 illustrates an enlarged portion of the semiconductor resistor strip shown in FIG. 2.

The resistor strip 40 includes a number of voltage taps, one shown as reference numeral 42. Voltage tap 42 is formed with the polysilicon material and is located near the bottom of the resistor strip 40, but is not connected directly to ground. Another voltage tap providing the next analog voltage is shown as reference numeral 44. The bottom portion of the resistor strip 40 is shown in more detail in FIG. 3. The polysilicon resistive material is deposited and masked to provide the voltage taps 42 and 44 on one side thereof. The mask that is used to form the linear strip 40 is also used to form each voltage tap. Corresponding voltage taps 46 and 48 are formed on the other side of the polysilicon resistive strip 40. In a conventional manner, a masking oxide 50 (shown in FIG. 3) is subsequently deposited and patterned so as to cover all of the body of the resistor strip 40, except for the terminal ends of all of the voltage taps, and a bottom current-carrying contact. Then, the unmasked portion of the arms of each voltage tap, such as that shown by reference numeral 52, is silicided in a conventional manner to provide a suitable contact surface to the polysilicon material. Thereafter, the voltage taps located on the opposite sides of the resistor strip 40, such as taps 42 and 46, are short circuited by a metal conductor strap 54. The metal conductor strap 54 contacts the polysilicon voltage taps at contact areas 56 and 58. Each of the other pairs of opposing polysilicon voltage taps is short circuited with a respective conductor in a similar manner. The metal conductor strap 54 shown in FIG. 3 is extended to a switch arrangement 60, as are the remaining shorting conductors of the resistor strip 40. By providing a contact on opposing side edges of the resistor strip 40, and short circuiting the opposing contacts together, a more uniform voltage is obtained from each tap as current passes between the top and bottom contacts and through the linear body of the resistor 40.

With reference yet to FIG. 3, the bottom portion 62 of the polysilicon resistor strip 40 is also silicided to provide a contact 64 to the ground metalization of the integrated circuit. As will be described in more detail below, improved linearity and accuracy are achieved by making a non-zero voltage at $tap_0$ the minimum analog voltage (DAC zero reference) generated by the resistor strip 40, rather than a ground voltage. It can be appreciated that the voltage between $tap_0$ and ground may vary from chip to chip because of processing variations, as well as aging, in addition to the quality and nature of the contact 64 connecting the bottom of the resistor strip 40 to the circuit ground.

However, the voltage difference (Δv) between $tap_0$ and $tap_1$ is substantially identical to that between each of the other voltage taps of the resistor strip 40. This consistency in Δv between the voltage taps of the resistor strip 40 substantially improves the linearity of the converter. In a practical embodiment, a resistor string resistance and a reference voltage driving the resistor string produce a Δv of about 9.8 mv.

With reference back to FIG. 2, the resistor strip 40 is divided into two sections, namely a 16-resistor section 70 defining a D/A converter for the least significant bits of the digital word, and a 256-resistor section 72 for use in the conversion of the most significant bits, and in some instances the least significant bits of the digital word. The decoding of eight MSB bits of the digital word initiates a primary search which controls the switch arrangement 60 to sequentially close one switch at a time according to a standard algorithm to select one of the 256 voltage taps of resistor strip section 72.

The switch of the arrangement 60 that was closed to determine the analog voltage corresponding to the MSB remains closed during a secondary search. In the secondary search, the remaining switches of the arrangement 60 can be sequentially operated to find an analog voltage that corresponds to the least significant bits of the digital word. The secondary search involves the operation of those switches associated with voltage taps located above the voltage tap in resistor section 72 selected during the primary search. The secondary search may also involve the selection of a voltage tap in the resistor section 70. The voltage taps in resistor section 70 are necessary, in the event the voltage tap selected during the primary search is near the upper end of resistor section 72. If the LSB of the digital word corresponds to four bits, at least fifteen voltage taps are needed above the voltage tap corresponding to the MSB. The voltage obtained from the taps located above the MSB voltage taps is coupled through a capacitor divider arrangement to provide to the amplifier 75 an analog voltage that is effectively less than the voltage of the MSB taps. This is due to the relative values of the coupling capacitors 71 and 72 of the capacitor divider arrangement. This will be described more fully below.

In this embodiment, no more than 256 voltage taps are required in the resistor strip section 72, until the MSB selection ends up at a voltage tap that is greater than $tap_{240}$, which is equivalent to 256 minus 16. As noted above, the remaining four LSB bits of the digital word are decoded to cause the switch arrangement 60 to close one switch to select the voltage of one of the 15 taps above the selected MSB voltage tap. Sixteen additional voltage taps in resistor string section 70 are provided above voltage $tap_{256}$ so that a full 4,096 unique analog voltages are ultimately provided in the circuit of FIG. 2. More particularly, each switch of a pair, such as switches 62 and 64, is closed during the determination of the MSB bits. Thereafter, one switch of the pair remains closed and connected to the voltage tap corresponding to the MSB analog voltage, and the other switch of the pair is opened during the secondary search. During the secondary search of the LSB analog voltage, only the switches connected to the coupling capacitor 71 are sequentially closed, starting with such switch located just above the selected MSB voltage tap. Importantly, the value of capacitor 71 is unit value one, while capacitor 72 is of unit value 15. With different capacitor values, the voltage selected from the voltage taps during the LSB determination is divided proportionately, thereby providing smaller voltage increments for the LSB bits, as compared to the Δv voltage increments for the MSB bits. With this arrangement, a 12-bit digital word can be converted into a corresponding analog voltage using fewer than $2^{12}$ resistors. This presents a decided advantage over other types of resistor strings that utilize different value resistors to achieve smaller voltage increments for the least significant bits. U.S. Pat. No. 5,731,725 discloses such type of resistor string.

The manner in which the most significant bits are converted into an analog voltage results in a monotonic process. The standard SAR search algorithm insures that both the primary and secondary searches will result in monotonicity.

The resistor strip 40 is driven by a voltages $V_{drive}$, which is the output of an operational amplifier 74. The operational amplifier 74 includes a non-inverting input coupled to a reference voltage $VREF_{in}$. The inverting input of the amplifier 74 is coupled to $tap_{255}$ located at the top of the lower resistor section 72, which also establishes the lowest magnitude voltage $VREF_{sense}$ to upper resistor strip section 70. The output of the operational amplifier 74 provides the voltage $V_{drive}$ for driving $tap_{271}$ of the upper resistor strip section 70. With this arrangement, the high-gain feedback fixes the Thevenin voltage at the $tap_{255}$ and affords a very low Thevenin resistance. Importantly, no current is carried through the contacts associated with $tap_{255}$. The reason for this is that the non-inverting input of the operational amplifier 74 is a high impedance input. Indeed, the only contacts of the resistor strip 40 that carry a steady state current in accordance with the invention are the top voltage tap connected to $V_{drive}$ and the bottom contact connected to ground. It is noted in FIG. 2 that each resistor strip voltage tap is connected through a switch of the switch arrangement 60 to a coupling capacitor which couples the selected analog voltage to an amplifier. Transient currents can be coupled through the respective voltage taps to the coupling capacitors 71 and 72, but the circuit can be designed so that such transients settle to tolerable levels within the time allotted. It can be appreciated that while the resistor string is driven by a voltage source, the principles and concepts of the invention can be realized with current-driven resistor strings.

Each resistor strip voltage tap is coupled to a pair of coupling capacitors 71 and 72 by way of the switch arrangement 60. In practice, each switch of the switch arrangement 60 is constructed with a PMOS and an NMOS transistor to form a transmission gate. As shown in FIG. 2, $tap_0$ is coupled to one pole of switch 62 and to another pole of switch 64. Switch 62, when closed, connects $tap_0$ to a common switch bus 66. In like manner, when switch 64 is closed, $tap_0$ is coupled to common switch bus 68. The remainder of the resistor strip voltage taps are coupled to respective switches, and therethrough to the common buses 66 and 68.

The common switch bus 66 is connected to coupling capacitor 72, and the common switch bus 68 is connected to coupling capacitor 71. As noted in the circuit diagram, the capacitance value of coupling capacitor 72 is fifteen times the value of coupling capacitor 71. The significance of this will be described below. One plate of each coupling capacitor 71 and 72 is coupled in common to the inverting input of an auto-zero amplifier 75. The non-inverting input of the amplifier 75 is connected to a common mode reference voltage designated $V_{cm}$. A feedback switch 76 is coupled between the output 78 of the auto-zero amplifier 75 and the inverting input. The feedback switch 76, which in practice is a transmission gate, is initially closed to place a voltage on the inverting amplifier input. The voltage placed on the inverting input corresponds to $V_{cm}-V_{offset}$. The offset is the inherent offset voltage of the auto-zero amplifier 75. The output of the auto-zero amplifier 75 is coupled to a successive approximation register (SAR) circuit (not shown). The inverting input of the auto-zero amplifier 75 constitutes the analog output 80 of the digital-to-analog converter.

With reference again to the feedback switch 76, the amplifier 75 functions as a unity gain amplifier when the feedback switch 76 is closed, and functions as a comparator when the feedback switch 76 is open. The feedback switch 76 is opened by clock circuits (not shown) so that when one or more of the decoding switches 60 are closed, the voltage from the selected voltage tap of the resistor strip 40 is coupled to the coupling capacitors 71 and 72. The decoding switches 60 are controlled by a DAC control 82. The DAC control 82 receives the digital bits to be converted and controls the decoding switches 60 to operate appropriately to carry out the conversion. The auto-zero function is carried out only once during the conversion of a digital word. Those skilled in the art are readily familiar with the circuits required for the DAC control 82 to operate the decoding switches 60. The DAC control 82 follows a predefined algorithm in order to efficiently determine which switch closures are appropriate for finding the MSB voltage and the LSB voltage. In view of the functional cooperation between the resistor strip 40, the coupling capacitors 71 and 72 and the switch arrangement 60, there are provided 4,096 different combinations of analog voltages. As a result, 12 bits of a digital word ($D_0$–$D_{11}$) are coupled to the DAC control 82.

In accordance with an important feature of the invention, analog voltages are extracted from the resistor strip 40 in such a manner that parasitic grounding resistances, and the like, inherent in the bottom current-carrying contact of the resistor strip 40 do not affect or otherwise compromise the linearity of the digital-to-analog conversion process. Rather than associate circuit ground with the smallest digital value 000 . . . 000, the voltage at $tap_0$ is associated with the smallest digital value. By utilizing this technique, the voltage generated across any undesired or parasitic ground resistance does not contribute to the non-linearity of the conversion process. Thus, as long as the resistor strip 40 is fabricated with a uniform semiconductor resistance, and with uniformly-spaced voltage taps, the voltage between each tap will ideally be identical, thus significantly improving the linearity when converting digital signals to corresponding analog signals.

Figure 1:
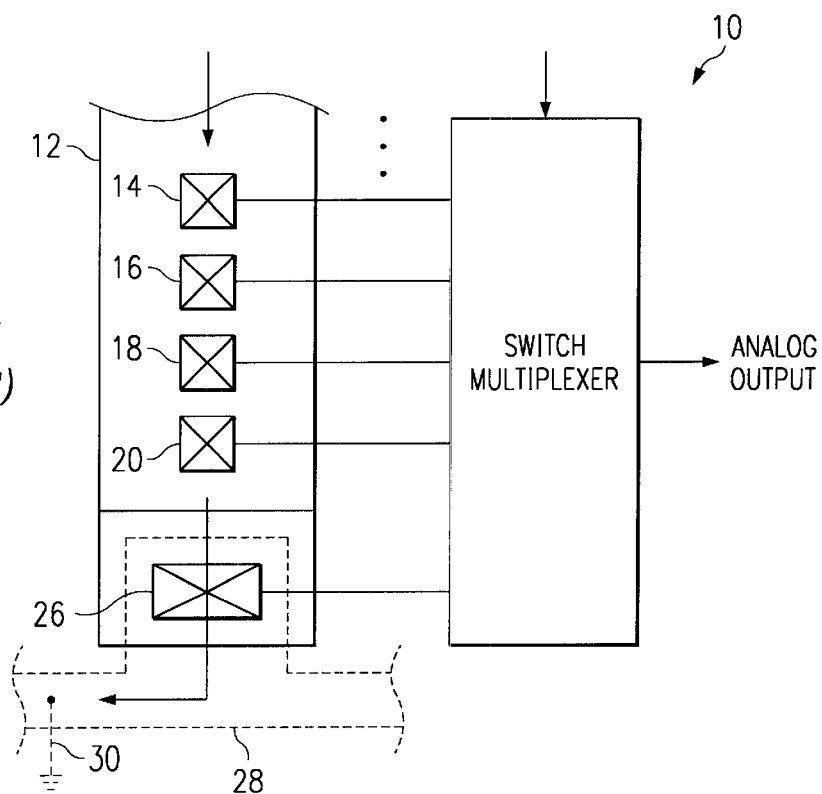
FIG. 1 is a diagram of a semiconductor resistor strip fabricated in accordance with the prior art, with the voltage taps connected to a switch arrangement.

In accordance with the principles and concepts of the invention, the voltage at the prior art ground tap 22 (FIG. 1) is disregarded in the conversion process, and the voltage at the first resistor tap ($tap_0$ of FIG. 2) formed in the polysilicon resistor strip 40 above ground is used as the reference or smallest voltage corresponding to the digital word 000 . . . 000. The voltage at $tap_0$, on conductor 54, is made the smallest analog voltage in the conversion process. The smallest magnitude of a non-zero analog voltage used in the conversion process is accomplished by initially charging the coupling capacitors 71 and 72 with the voltage at $tap_0$. In the initial automatic zeroing of the D/A converter, which occurs before the D/A conversion process itself is carried out, the feedback switch 76 is closed to thereby couple the auto-zero amplifier output 78 to the inverting input. During a clock phase in which the auto-zeroing function is carried out, decoder switches 62 and 64 are closed, thereby coupling the voltage at $tap_0$ to one plate of each coupling capacitor 71 and 72. At the same time, the common mode voltage ($V_{cm}$) and any amplifier offset voltage are coupled via feedback switch 76 to the other plates of coupling capacitors 71 and 72. The coupling capacitors are thus charged to a voltage $V_{tap}= V_{tap0}-V_{cm}+V_{offset}$.

After the initial automatic zeroing function is carried out, feedback switch 76 is opened, and the amplifier 75 is configured as a comparator. The successive approximation conversion process is then carried out in order to find which specific closures of the switches of the decoder 60 produce an analog voltage corresponding to the digital word to be converted. This successive approximation sequence utilizing a resistor strip 40 is disclosed in detail in the co-pending application filed Oct. 15, 1999 and assigned Ser. No. 09/419,148 and entitled "A/D CONVERTER WITH VOLTAGE/CHARGE SCALING." As described in such application, the switch decoder 60 is controlled so as to place coupling capacitor 71 and coupling capacitor 72 in parallel during the primary search, and test various combinations of the voltages between $tap_0$ and $tap_{255}$ to determine the logic state of the first eight bits. When the state of the first eight bits is determined, those switches coupling the resistor strip 40 to the coupling capacitor 72 are maintained as such, and the other switches associated with coupling capacitor 71 are sequenced during the secondary search to determine the logic state of the four LSBs of the digital word. It is further noted that with this type of D/A arrangement, in order to convert a 12-bit digital word into a corresponding analog voltage, the largest magnitude analog voltage generated by the resistor strip 40 is that produced by $tap_{270}$. While the resistor strip $tap_{271}$ and its corresponding switches are illustrated, they are not necessary to the conversion of the 12-bit word.

Although the auto-zeroing function is carried out by utilizing switches 62 and 64 of the decoding switches 60, other auxiliary switches could be used whose sole function is to couple the $tap_0$ voltage to the coupling capacitors 71 and 72 during the auto-zeroing clock cycle. In addition, for modes other than a unipolar mode, such as used in bipolar mode converters, the auto-zeroing function can be carried out by utilizing the voltage at $tap_{128}$ for the DAC zero reference and coupling the same to the coupling capacitors 71 and 72. Yet other tap or reference voltages can be utilized as the DAC zero reference to satisfy particular desires or needs.

While a single resistor strip 40 is shown in the embodiment of FIG. 2, in practice a pair of semiconductor resistor strips are utilized to generate analog voltages during the conversion process. A companion resistor strip (not shown) can be formed in the semiconductor material in a manner identical to that shown as resistor strip 40.

From the foregoing, disclosed is a digital-to-analog converter, and the method of conversion thereof, for improving the linearity of the conversion process. Rather than utilizing a ground voltage for a DAC zero reference, a voltage from the semiconductor resistor strip itself is utilized. With this arrangement, the inability to achieve a consistent ground voltage is alleviated, and in lieu thereof, a non-zero voltage obtained from the resistor strip is utilized. The value of the non-zero voltage is inconsequential, as the circuit is referenced or otherwise zeroed to such voltage. In addition, all other voltages between the taps of the resistor strip are substantially identical, thereby achieving improved linearity in converting digital signals to analog signals.

In accordance with another feature of the invention, the resistor strip 40 is constructed to minimize the effects of a mismatch of the resistances attributed to the structure of the voltage taps. While the preferred embodiment involves the connection of high impedance circuits to the voltage taps so that the effects of tap resistance is more inconsequential, it recognized that transient currents do flow through the tap resistance to charge parasitic capacitances, as well as the coupling capacitors 71 and 72. With less tap resistance, the parasitic circuit capacitances can be charged more quickly, and the speed of circuit operation can be increased. When the resistor strip 40 described above is used in conjunction with a companion resistor strip with cross-coupled shorting conductors therebetween, small currents may indeed flow between the nodes of the two resistor strips having similar tap voltages. In this instance, it is highly desirable to fabricate the resistor strip taps with the lowest resistance possible. The resistance of each voltage tap can be reduced by the techniques described in connection with FIGS. 4–6.

Figure 4:
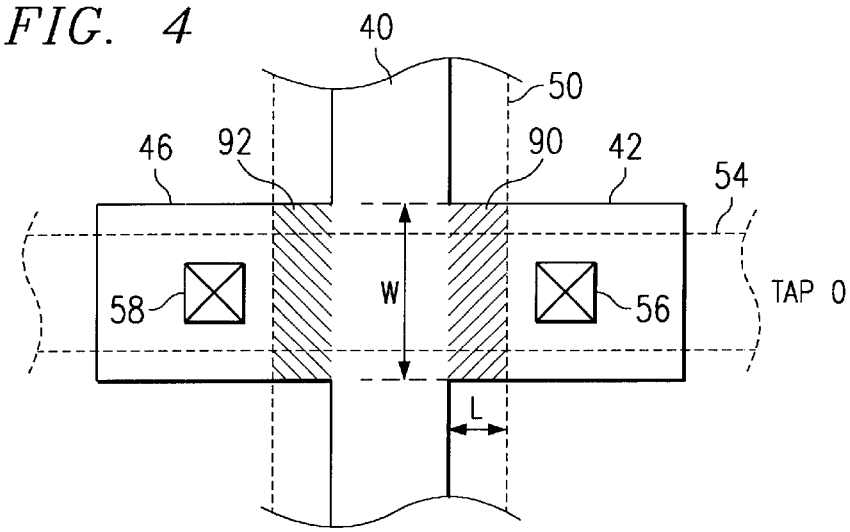
FIG. 4 is a much enlarged top view of a portion of a resistor strips constructed to reduce differences in overall resistances between the voltage taps.

Differences in the geometry of the voltage taps of the resistor strip 40 due to masking and other processing artifacts can introduce variations in the resistance between the voltage taps. For example, if the patterning of the resistive semiconductor material results in arms or extensions having slightly different lengths or widths, then the effective resistance between the voltage taps will be slightly different. If the contact in each voltage tap arm is not formed in the same respective location in each of the arms, then the effective resistance between the various voltage taps will be slightly different. These and other processing variations in forming the voltage taps are generally the result of differences in the resistance between the body of the resistor strip and the respective contacts. FIG. 4 illustrates one technique for reducing the differences in the effective resistance between the resistor strip body and the voltage tap contacts.

The resistor strip 40 of FIG. 4 includes a body of resistive semiconductor material that is generally patterned to be elongate and rectangular shaped. It is desirable to make the resistor strip 40 of a width and length such that the overall resistance is sufficiently small to make the time constant in charging parasitic capacitances small, but yet large enough such that a significant supply current is not drawn therethrough between the current-carrying contacts. As described above, during processing to fabricate the resistor strip 40, a protective oxide mask 50 is used to prevent the body of the semiconductor resistor from being silicided. The siliciding process would otherwise substantially lower the resistance of the polysilicon material. The edge of the protective oxide mask 50 extends somewhat beyond the side edge of the resistor strip body, to the extent defined by various design rules conventionally utilized in semiconductor processing. As a result, an inner portion of the arm of each voltage tap is not silicided and thus exhibits the characteristic resistance (ohms per square) of that of the body of the resistor strip 40. The inner portion of the arms of voltage taps 42 and 46 that are not silicided are shown cross-hatched as respective reference numerals 90 and 92. The outer portion of the arm of voltage tap 42 not covered by the protective oxide 50 is silicided and is shown with a metal contact 56 formed on the silicided surface of the arm. Each voltage tap arm is constructed in the same manner.

The resistance of the inner portion 90 of the voltage tap 42 is a function of the length (l) and width (w) thereof. It is desirable to make the arm of each voltage tap as wide and short as possible to minimize the resistance thereof. Because of the geometry, the resistance of the inner nonsilicided portion 90 of the arm is about one half of the characteristic ohm per square of the semiconductor body. The inner portion 92 of the arm of the other voltage tap 46 is similarly constructed, and thus has a similar resistance. As described above, the metal shorting strap 54 short circuits the contact 56 of voltage tap 42 to the contact 58 of the voltage tap 46. This arrangement effectively places the inner resistive arm portions 90 and 92 in parallel, thereby reducing the effective resistance thereof by a factor of two. In the event a companion resistor strip is utilized, the parallel resistances of the inner arms thereof are in series with that of the resistor strip 40. While the use of the companion resistor strip increases the resistance of the overall inner arm portions, the net resistance is nevertheless less than would otherwise result without the use of the shorting straps 54. As shown in FIG. 2, the resistor strip 40 is formed with a pair of opposed voltage taps at spaced locations along the body thereof. Each voltage tap of a pair is shorted together with a metal strap. The resistances inherent in the arms of the voltage taps is thus minimized, thereby improving the speed of operation in converting digital signals to corresponding analog signals.

Figure 5:
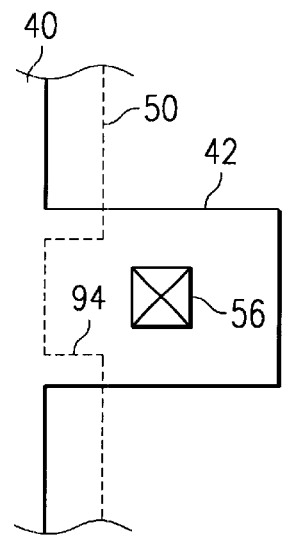
FIG. 5 is a top view of a portion of a resistor strip, with the masking oxide patterned to reduce the resistance in the arms of the resistor strip.

FIG. 5 illustrates a technique in which the masking oxide 50 is patterned to define an indented area 94 overlying the inner portion of the voltage tap arm 42. The indented area 94 can be square or rectangular shaped so that an increased area of the inner arm of the voltage tap 42 is subjected to the siliciding process. It is important that the indented area 94 does not overlie any of the body of the resistor strip 40, as the resistance of the strip would be adversely affected. The shape and size of the indented area should be selected such that mask misalignments do not cause the body of the resistor strip 40 to be silicided. With a greater area of the inner portion of the voltage tap arms being silicided to reduce the resistance thereof, improved operation of the resistor strip 40 is achieved.

Figure 6:
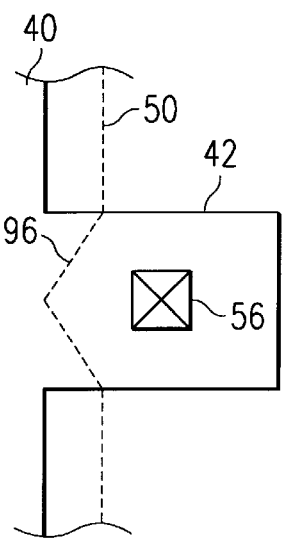
FIG. 6 is a top view of a portion of a resistor strip, with the masking oxide patterned in a shape different from that shown in FIG. 5, to reduce the resistance in the arms of the resistor strip.

With reference to FIG. 6, there is illustrated another variation of an indented area 96 in which the inner portion of the voltage tap 42 is subjected to the silicide process. Here, the indented area 96 is V-shaped. While the V-shaped indented area 96 does not reduce the resistance of the inner arm portion as much as the indented area 94 shown in FIG. 5, the V-shaped indented area 96 is less affected by misalignment of the masking oxide 50. Those skilled in the art may find that yet other indented area shapes are effective to reduce the resistance of the inner portions of the voltage tap arms. It is realized that each of the voltage taps can be formed with the same shape of indented, area so that the resistance of each voltage tap is uniform.

While the foregoing has been described in connection with the preferred and other embodiments of the invention, the principles and concepts can nevertheless be utilized and implemented in a form other than that disclosed above. It is therefore understood that many changes in detail may be made as a matter of engineering choices, without departing from the spirit and scope of the invention, as defined by the appended claims.

What is claimed is:

1. A digital-to-analog converter, comprising:
   a series resistor strip comprising a plurality of resistors connected together by respective junctions, each junction defining a resistor strip node;
   said resistor strip connected between a first reference and a second reference to produce a different analog voltage at each resistor strip node;
   an amplifier having an input selectively coupled to one said analog voltage;
   a plurality of switches coupling resistor strip nodes to said amplifier via at least one coupling capacitor; and
   an auto zeroing circuit for zeroing said amplifier to a node voltage other than said first reference and said second reference wherein said zeroing circuit is coupled to said amplifier for initially charging one plate of said coupling capacitor with a voltage of one said resistor strip node, and not said first or second reference, said zeroing circuit operating in a zeroing phase that occurs prior to a conversion phase in which a digital word is converted to a corresponding analog voltage.

2. The digital-to-analog converter of claim 1, wherein a voltage across each resistor of said resistor strip is substantially equal.

3. The digital-to-analog converter of claim 1, wherein an analog voltage at each resistor strip node, except a voltage of said first and second reference, is used as an analog voltage in a converting process.

4. The digital-to-analog converter of claim 1, wherein each said resistor strip node is coupled to a high-impedance circuit so that a steady state current is not drawn from said resistor strip nodes, except resistors connected respectively to said first reference and said second reference.

5. The digital-to-analog converter of claim 1, wherein at least one switch of said plurality of switches is operated during said zeroing phase to couple an analog voltage of one resistor strip node to said coupling capacitor.

6. The digital-to-analog converter of claim 1, further including a pair of switches coupling ones of said resistor strip nodes to a corresponding pair of coupling capacitors $C_p$ and $C_s$, and one plate of each said coupling capacitor is coupled to an input of said amplifier.

7. The digital-to-analog converter of claim 6, wherein said coupling capacitors $C_p$ and $C_s$ have different values, and wherein said coupling capacitors $C_p$ and $C_s$ are connected in parallel to resistor strip nodes to determine an analog voltage corresponding to a most significant bit of a digital word, and thereafter one said coupling capacitor $C_p$ or $C_s$ is switched to various resistor strip nodes to determine an analog voltage corresponding to least significant bits of the digital word.

8. A digital-to-analog converter, comprising:
   at least one resistor strip constructed of a resistive semiconductor material;
   a plurality of voltage taps of said resistor strip providing respective analog voltages;
   one said voltage tap defining a reference voltage tap providing a reference output voltage to which the analog voltages are related, said reference voltage tap formed as a junction between two resistors formed in said resistive semiconductor material; and
   a zeroing circuit for making said reference output voltage a reference voltage during initializing of said-digital-to-analog converter.

9. The digital-to-analog converter of claim 8, wherein said zeroing circuit includes a capacitor initially charged to a voltage as a function of said reference output voltage.

10. The digital-to-analog converter of claim 9, further including an amplifier having an input coupled to said capacitor, and a switch coupled across said amplifier for charging said capacitor to a voltage as a function of said reference output voltage.

11. The digital-to-analog converter of claim 8, wherein said reference voltage tap is not connected to ground.

12. A method of use of a digital-to-analog converter, comprising the steps of:
   providing a plurality of voltage taps on a semiconductor resistor strip, each said voltage tap providing an analog voltage as a result of current passing through said semiconductor resistor strip;
   zeroing the digital-to-analog converter by charging a capacitor to a reference voltage as a function of the analog voltage at one said voltage tap; and
   after said zeroing step, selecting an analog voltage from said voltage taps as a function of logic states of bits of a digital word to convert the digital word to a corresponding analog voltage.

13. The method of claim 12, further including providing a path to apply said reference voltage to one plate of said capacitor, and applying another voltage to another plate of said capacitor.

14. The method of claim 13, further including providing circuits for applying analog voltages from said voltage taps to said one plate of said capacitor during conversion of the digital word to a corresponding analog voltage.

15. The method of claim 12, further including constructing said digital-to-analog converter so that current passes in one end of said resistor strip and out an opposite end of said resistor strip, and substantially no current flows through said voltage taps.

16. The method of claim 15, further including providing an electrical contact formed at said ends of said resistor strip, and further including providing tap voltages used in the conversion that are independent of an electrical quality of said electrical contacts.

* * * * *

UNITED STATES PATENT AND TRADEMARK OFFICE
CERTIFICATE OF CORRECTION

PATENT NO.      : 6,529,152 B1
DATED           : March 4, 2003
INVENTOR(S)     : Douglas S. Piasecki and Ka Y. Leung It is certified that error appears in the above-identified patent and that said Letters Patent is hereby corrected as shown below:

<u>Title page,</u>
Item [73], Assignee, replace "Cyngal" with -- Cygnal --

Signed and Sealed this

Tenth Day of June, 2003

JAMES E. ROGAN
*Director of the United States Patent and Trademark Office*